United States Patent [19]
Lehoczky et al.

[11] Patent Number: 4,545,848
[45] Date of Patent: Oct. 8, 1985

[54] HCT CRYSTAL GROWTH METHOD

[75] Inventors: Sandor L. Lehoczky; Frank R. Szofran, both of Huntsville, Ala.

[73] Assignee: McDonnell Douglas Corporation, St. Louis, Mo.

[21] Appl. No.: 439,800

[22] Filed: Nov. 8, 1982

[51] Int. Cl.$^4$ ............................................. C30B 21/02
[52] U.S. Cl. ................................................. 156/616 R
[58] Field of Search ...... 156/616 R, 616 A, DIG. 72, 156/DIG. 82, DIG. 73

[56] References Cited
U.S. PATENT DOCUMENTS 3,514,265  5/1970  Pastore ........................... 156/616 R
4,050,905  9/1977  Swinehart ........................ 156/616 R

OTHER PUBLICATIONS

Micklethwaite, Semiconductors & Semimetals, vol. 18 Mercury Cadmium Telluride, Academic Press, 1981, pp. 47–119.
Fiorito et al., J. Electrochem. Soc.: Solid-State Science and Technology, pp. 315–317, 2/78.
Szofran et al., The Pseudobinary HgTe-CdTe Phase Diagram, J. Electronic Materials, vol. 10, p. 1131 (1981).

Primary Examiner—Hiram H. Bernstein
Attorney, Agent, or Firm—Rogers, Howell, Renner, Moore & Haferkamp

[57] ABSTRACT

A method of preparing pseudobinary mercury, cadmium, telluride (HCT) crystals by controlled crystal growth in a fused silica ampule uses a modified Bridgman-Stockbarger method. In this method, the alloy is cast into one end of the ampule, inverted, heated to a temperature between the liquidus and solidus temperatures of the alloy and directionally solidified in a two zone furnace. The parameters of the solidification treatment are controlled according to the formula $$T_U{}^4 - T_I{}^4 = T_I{}^4 - T_L{}^4,$$

where $T_U$ = the temperature of the furnace upper zone, $T_L$ = the temperature of the furnace lower zone, and $T_I$ = the solidus temperature of the crystal composition. The rate of transfer of the crystal through the furnace and the size of the zone barrier are also controlled. The modified method imparts homogeneity to the crystal composition, both axially of the crystal and radially. The crystals produced by the method have superior properties and a much higher yield.

20 Claims, 2 Drawing Figures

HCT CRYSTAL GROWTH METHOD

BACKGROUND AND SUMMARY OF THE INVENTION

Pseudobinary mercury, cadmium, telluride (HCT) alloy crystals are uniquely suited for use in infrared detectors for a variety of reasons. HCT crystals have the unique property that the energy gap can be varied from 0 to 1.5 eV by varying the composition. The spectral response of an infrared detector incorporating the crystals can be matched to any wave length in the range of 1 to 50 μm at working temperatures at or above 77° K. The HCT alloys produce semiconductors having high absorption coefficients with low intrinsic carrier concentrations and high electron mobilities. These valuable properties of HCT alloys have been recognized for many years, but at present, the potential of such alloys and of detectors and other devices incorporating such alloys has been limited by a variety of difficulties in growing crystals of sufficient homogeneity and reasonable size.

The standard method of producing HCT crystals is by solid state recrystalization. In solid state recrystalization, a solid of uniform composition is formed by melting the alloy constituents together and quenching. However, quenching introduces stress and crystal defects and causes microscopic lack of homogeneity which makes the crystals useless as good detectors, as formed. In order to utilize crystals formed by the solid state recrystalization method, it is necessary to anneal the crystals for long periods of time to obtain a composition which has an equilibrated structure and a satisfactory uniformity of composition. Six to eight weeks is usually required in the annealing process. Even then, the overall yield of crystals obtained by this method is quite low.

Recently, some interest has developed in using a modified Bridgman-Stockbarger method of crystal growth in order to obtain crystals of uniform composition and having a low incidence of sub-microscopic crystal defects, or localized inhomogeneity. A recent discussion of this method can be found in the *Journal of the Electrochemical Society*, Volume 125 (1978) beginning at page 315, entitled "A Possible Method for the Growth of Homogeneous Mercury Cadmium Telluride Single Crystals." It has been found, however, that the Bridgman-Stockbarger method tends to create crystals which do not have a satisfactory homogeneity, both in the axial direction along the major axis of the ampule in which the crystal is formed and also radially outward from the axis of the crystal. As a result, crystals formed by this method have not been acceptable as crystals for infrared detectors, for example, due to the extremely low yield of suitable crystals formed by this method. Moreover, the Bridgman-Stockbarger method has not been suitably reliable; it has not given reproducible results when used to grow HCT crystals.

Applicants have discovered a method of controlling the crystalization parameters of a modified Bridgman-Stockbarger method which enables homogeneous crystals to be reproducibly formed by that method, both in a radial and axial direction. Applicants' method may be utilized to produce HCT crystals for devices requiring a uniform spectral response, for example, in infrared detectors, but may also be used to produce other alloy crystals as well.

DESCRIPTION OF THE PREFERRED EMBODIMENT

In the Bridgman-Stockbarger method, typically, a composition for the desired crystal is sealed in a vitreous silica ampule and then directionally solidified by translating the ampule through a furnace having two zones, a hot upper zone and a cold lower zone. The alloy is melted in the hot zone of the furnace and then, as the ampule travels into the cool zone of the furnace, a portion of the liquid solidifies in the bottom of the ampule, growing the crystal toward the top of the ampule. It should be understood that ampule travel is a relative term and can be produced either by travel of the ampule through a fixed furnace or by fixing the ampule in space and moving the furnace relative to the ampule.

In the Bridgman-Stockbarger method, inhomogeneity of the formed crystal can be introduced in two ways. Axially the composition is subject to variation since cadmium telluride tends to freeze out of the liquid phase at a preferential rate compared to mercury telluride. This causes a gradient in cadmium content axially along the crystal, that is, in the direction of crystal growth. In addition, the physical conditions at the interface of the crystal, the surface at which crystal growth occurs, causes radial compositional redistribution by either diffusion or flow of the liquid which is being solidified, that is, composition variation in the liquid transverse to the solidification axis (direction of crystal growth and furnace travel.) This results in inhomogeneity due to preferential freezing out of cadmium telluride and mercury telluride, in varying ratios from the radially inhomogeneous liquid. It is believed that the radial redistribution of the melt may be caused by a curvature of the liquid solid interface.

Figure 1:
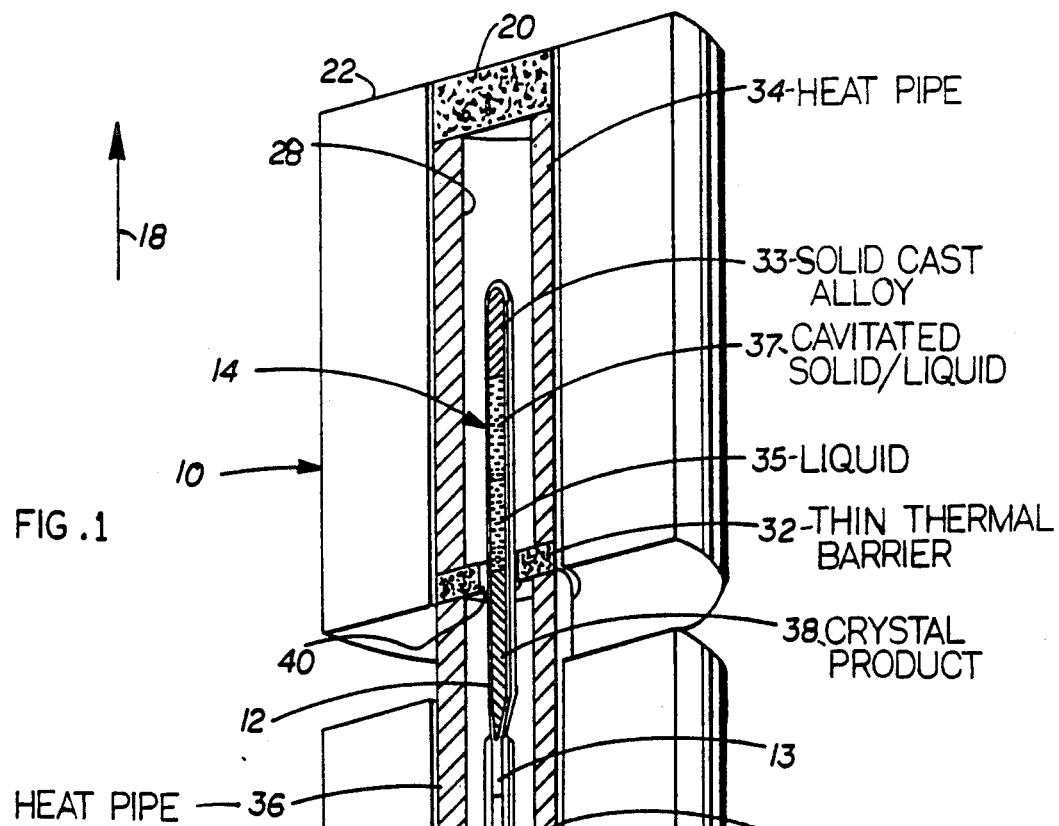
FIG. 1 shows a Bridgman-Stockbarger furnace assembly utilized in the process of the invention.

Applicants have devised a method which reduces the inhomogeneity of the fused crystal, both in an axial and in a radial direction. Referring in more detail to FIG. 1, a typical Bridgman-Stockbarger furnace 10 is shown. The furnace 10 surrounds an ampule 12 in which an alloy 14 has been cast. An integral part of the ampule 12 is a rod 13 shown on the bottom end in FIG. 1. The ampule 12 is supported by a silica pedestal 16 and the furnace 10 is moved in the direction of travel shown by arrow 18. The furnace has a thermal insulator 20 at the closed end 22 and a small opening 24 at the opposite end through which the pedestal 16 passes. A second thermal insulator 26 surrounds the silica pedestal at the lower end of the furnace 10. The furnace 10 is divided into two zones, a hot zone 28 and a cool zone 30, by thermal barrier 32. In the hot zone 28, a sodium heat pipe 34 surrounds the ampule 12 and in the lower cool zone 30 a sodium or mercury heat pipe 36 surrounds the ampule 12.

In the modified Bridgman-Stockbarger method employed by applicants, the crystals are prepared by first preparing an HCT alloy composition by reacting 99.9999% pure elemental constituents in sealed and evacuated silica ampules 12. The ampules 12 are first cleaned thoroughly, for example, the final cleaning may be with dilute hydrofluoric acid solution, and the ampules 12 are vacuum annealed, for example at about 1100° C. The ampules 12 are loaded with precisely measured amounts of mercury, cadmium and tellurium. Following loading, the ampules 12 are evacuated and sealed and the alloys are cast in a rocking furnace to obtain a uniform cast composition.

Each HCT alloy is cast in the blunt end of the ampule 12. The reverse end of the ampule 12 is pointed and the pointed end is supported by the silica pedestal 16, as shown. The ampule 12 containing an alloy 14 is arranged so that the entire ampule 12 is placed into the hot zone 28 of furnace 10. The hot zone 28 is initially at room temperature. The unfilled part of ampule 12 is at the bottom pointed end. The hot zone 28 is then raised to a temperature between the liquidus and solidus temperatures of the alloy so that the alloy partially liquifies. In this condition the remaining solid, which is permeated with cavities, shown at 33, remains in the upper part of the ampule 12. The liquid, shown at 35, under the influence of gravity, collects in the bottom or pointed end of the ampule 12. With the proper choices of ampule fill factor and hot zone temperature, the liquid and cavitated solid will be interpenetrated with an intermediate solid/melt layer 37, with only small volumes of pure liquid at the bottom and dry solid at the top, as shown. Then, crystal growth is started from the bottom, as in the Bridgman-Stockbarger method. Proper fill means that the ampule is filled as full as can be reasonably accomplished, leaving a space sufficient to permit sealing of the ampule, as is known in the art.

As the growth proceeds the cavitated solid 33 melts from the bottom up. This leaves an approximately constant sized zone of pure liquid 35 between the growing solidified crystal at the bottom of the ampule 12 and the shrinking cavitated solid 33 at the top of the ampule 12. By utilizing this method, the cavitated solid provides a relatively constant source of cadmium to the liquid 35 above the fusing crystal 38. As crystallization proceeds axially along the ampule 12 there is relatively little change in the overall composition of the crystal in an axial direction compared to the compositional changes that would result from similar crystallization rates if the normal Bridgman-Stockbarger method were employed.

As shown in the FIG. 1, the ampule 12 is stationary during the growth process. The furnace assembly travels upward on vertical ways, not shown, so that the crystal grow progressively upward from the bottom tapered end of the ampule 12. The heated tubular zones 28 and 30 are separately controlled to provide hot and cold zones. For example, zones 28 and 30 may be electrical resistance furnaces. Each zone 28, 30 is provided with heat pipe isothermal furnace liners 34 or 36 to provide two well defined heated zones. The hot zone 28 heat pipe 34 is sodium charged and the cold zone 30 heat pipe 36 is either sodium or mercury charged depending on the temperature requirements. The heat pipes 34, 36 are separated by a heat barrier 32. Besides providing the necessary thermal isolation between the heated zones 28, 30, the barrier 32 also provides a semi-adiabatic region and provides a sharp temperature drop between zones. The circular opening 40 in the barrier is spaced as close to the surface of ampule 12 as is practicable and is normally 2 mm larger in diameter than the outside diameter of the ampule 12. Barrier 32 should be of an insulating material such as a fibrous ceramic board, such as those made from alumina, silica or zirconia fibers, or combinations of these material, or other material of equivalent insulating properties. The material should withstand furnace temperatures of up to about 1100° C. and should preferably be formable or machinable. Materials meeting these requirements are readily available. These materials allow the heat flow rate from the upper (hot) zone 28 to lower (cool) zone 30 to be kept small enough that the temperature of the lower zone 30 is controlled by the lower furnace and its temperature controller, not by the heat flow from the upper furnace.

Figure 2:
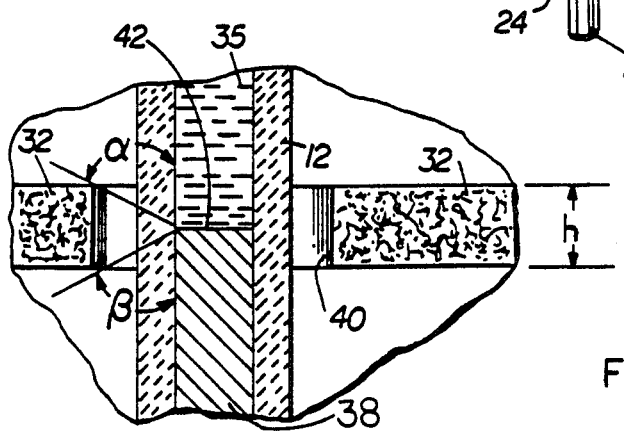
FIG. 2 shows the definition of view angles $\alpha$ and $\beta$.

The thickness of barrier 32 has an effect on the homogeneity of crystals grown in applicants' modified process. For that reason it is preferred that the thickness, h, of barrier 32 be as small as possible, typically less than 4 mm, so that the view-angle projections into the heated zones, $\alpha$ and $\beta$ defined in FIG. 2, are as large as possible while still providing adequate thermal isolation between the heated zones. This choice of barrier thicknesses is in contrast to the generally accepted notion that thick thermal barriers are desirable, if not essential, to maintain flat radial isotherms and thus radially homogeneous melts. In fact, the applicants have discovered that because of the likely differences between the thermal conductivities in the solid crystal and the melt near the melt/crystal interface 42, and because the thermal conductivity of fused silica is comparable to the thermal conductivities of the alloys, the use of thick barriers results in radial temperature gradients that result in radially inhomogeneous melts and thus in radially inhomogenous crystals.

Ideally, the interface is located in the middle of the thermal barrier 32 and in this case $\alpha$ equals $\beta$. The applicants have discovered that this desirable condition can be approached for the alloy system when the upper zone temperature $T_U$, the lower zone temperature $T_L$ and the solidus temperature $T_I$ for the initial material composition ($x_o$) are related by the following relationship:

$$T_U^4 - T_I^4 = T_I^4 - T_L^4.$$

(This equation represents the condition for a radiative heat balance for a case of equal emissivities when the temperature at the center of the thermal barrier 32 is equal to the liquid/solid interface temperature $T_I$.) It is important that the temperatures obey the above relationship. Usually, the upper zone temperature, $T_U$, is chosen to be about 10° below the liquidus temperature and the lower zone temperature, $T_L$, is calculated from this temperature and the known interface temperature, $T_I$, the solidus temperature of the composition $x_o$. It is preferred to use the highest value choice of $T_U$ which will fulfill the temperature relationship. To avoid complete melting of the precast ingot, however, $T_U$ must remain below the liquidus temperature. The farther below the liquidus $T_U$ is, the larger the fraction of the precast ingot that remains in cavitated solid form. Some solid should remain, but we believe that very little solid needs to remain. The accuracy in setting $T_U$ is about $\pm 5°$ C. The liquidus is known to about $\pm 4°$ C. for most compositions of interest ($0.15 \lesssim x_o \lesssim 0.6$). Therefore, $T_U$ is set at about 10° C. below the nominal liquidus temperature to optimize all conditions and accomodate all variables.

In addition to meeting the requirement of preventing constitutional supercooling in the melt, applicants have discovered additional parameters for the process. The furnace translation rate, R, should conform to the following relationship $$dx/dl|_{l=0} = (x_o R/D)(k-1)/k.$$

D is an empirically determined diffusion coefficient determined by the method based on the theory of V. G. Smith, W. A. Tiller and J. W. Rutter, as is known. $x_o$ is the intial overall material composition and k is the segregation coefficient for the composition. k is the ratio of the solid composition to the liquid composition, determined from the phase diagram, at the particular temperature, as is known. The value 1 is the distance to the interface. When dx/dl at the interface exceeds a critical value, compositional redistribution will result for any nonflat interface shape. (It is believed the occurance of a flat interface is unlikely.) The value dx/dl at the interface should be less than about 8.5 times $10^{-4}$ cm$^{-1}$. Applicants have demonstrated that a value of 1.85 times $10^{-4}$ cm$^{-1}$ is effective to produce suitable crystals. (In this case the constant D equals 5.5 times $10^{-5}$ cm$^2$ per second and k equals 4.) A typical value for R is about 0.068 μm/second for $x_o$ about 0.2, a typical maximum is about 0.3 μm/second.

By using applicant's method as described herein, $Hg_{1-x}Cd_xTe$ ingots with radial compositional homogeneity adequate for fabricating infra red detector devices, and with longitudinal compositional variations of less than 0.05 in x over the central 40% of a 25 cm long ingot can be prepared. The following examples illustrate applicants' method of growing HCT crystals and the resulting homogeneity.

EXAMPLE 1

A homogeneous HCT ingot crystal was prepared by a comparative method, but using a thin barrier, as follows: The $Hg_{1-x}Cd_xTe$ alloy was prepared by reacting 99.9999% pure elemental Hg, Cd and Te constituents in a sealed evacuated fused silica ampule. The inside diameter of the ampule was 12 mm. The end of the ampule was tapered to a point to enhance the probability of single crystal growth. A silica rod was fused directly to the tapered end of the ampule to position the ampule inside the growth furnace. The ampule was loaded with precisely weighed amounts of mercury, cadmium and tellurium. Following loading the ampule was sealed and the molten alloy was mixed in a rocking surface at about 825° C. for over six hours and then was cast in the blunt end of the ampule. The molar ratio of mercury, cadmium and tellurium was Hg=0.850, Cd=0.150 and Te=1.000, that is, the overall material composition, $x_o$, was 0.150.

The precast alloy was grown by unidirectional solidification in the furnace described above. The ampule was initially positioned in the upper zone and remained stationary during the growth process. The furnace assembly traveled upward in relationship to the ampule so that crystal grew progressively upward from the bottom tapered end of the ampule. The thickness h of the thermal barrier 32 was 1 mm. The rate R of furnace translation was 1.26 cm/day (0.146 μm/second). The solidus temperature, $T_I$, for this initial material composition $x_o$ was 695° C. and $T_U$ was 712° C., about 52° C. below the liquidus temperature for the initial material composition $x_o$. The lower zone temperature $T_L$ was 670° C. The axial and radial composition of the crystal formed in Example 1 is shown in the Summary Table.

EXAMPLE 2

A homogeneous HCT ingot crystal was prepared by a comparative method as follows: The $Hg_{1-x}Cd_xTe$ alloy was prepared by reacting 99.9999% pure elemental Hg, Cd and Te constituents in a sealed evacuated fused silica ampule. The end of the ampule was tapered to a point to enhance the probability of single crystal growth. A silica rod was fused directly to the tapered end of the ampule to position the ampule inside the growth furnace. The ampule was loaded with precisely weighed amounts of mercury, cadmium and tellurium. Following loading the ampule was sealed and the molten alloy was mixed in a rocking furnace at about 825° C. for at least 6 hours and then cast in the blunt end of the ampule. The molar ratio of mercury, cadmium and tellurium was Hg=0.691, Cd=0.309 and Te=1.000. that is, the overall material composition $x_o$ was 0.309.

The precast alloy was grown by unidirectional solidification in the furnace described above. The ampule was initially positioned in the upper zone and remained stationary during the growth process. The furnace assembly travels upward in relationship to the ampule so that crystal grew progressively upward from the bottom tapered end of the ampule. The thickness h of the thermal barrier 32 was 38 mm. The rate R of furnace translation was 1.10 cm/day (0.127 μm/second.) The inside diameter of the ampule was 10 mm. The solidus temperature, $T_I$, for this initial material composition $x_o$, was 727° C. and $T_U$ was 824° C. (about 20° C. below the liquidus temperature for the initial material composition, $x_o$. The lower zone temperature $T_L$ was 220° C. The axial and radial composition of the crystal formed in Example 2 is shown in the Summary Table. Due to the extreme variation in slice compositional variation, Δx, in Example 2, no reliable measure of slice composition, x, could be made.

EXAMPLE 3

A homogeneous HCT ingot crystal was prepared by applicant's method as follows: The $Hg_{1-x}Cd_xTe$ alloy was prepared by reacting 99.9999% pure elemental Hg, Cd and Te constituents in a sealed evacuated fused silica ampule. The end of the ampule was tapered to a point to enhance the probability of single crystal growth. A silica rod was fused directly to the tapered end of the ampule to position the ampule inside the growth surface. The ampule was loaded with precisely weighed amounts of mercury, cadmium and tellurium. Following loading the ampule was sealed and the alloy was cast in a rocking furnace at about 845° C. for at least 6 hours and then cast in the blunt end of the ampule. The molar ratio of mercury, cadmium and tellurium was Hg=0.791, Cd=0.209 and Te=1.000, that is, the overall composition, $x_o$, was 0.209. $(dx/dl)_{l=o} = 1.85$ times $10^{-4}$ cm$^{-1}$, k=3.8.

The precast alloy was grown by unidirectional solidification in the furnace described above. The ampule was initially positioned in the upper zone and remained stationary during the growth process. The furnace assembly traveled upward in relationship to the ampule so that crystal group progressively upward from the bottom tapered and of the ampule. The thickness h of the thermal barrier 32 was 4 mm. The rate R of furnace translation was 0.62 cm/day (0.072 μm/second.) The inside diameter of the ampule was 12 mm. The solidus temperature, $T_I$, for this initial material composition $x_o$ was 706° C. and $T_U$ was 780° C. (about 10° C. below the liquidus temperature for the initial material composition, $x_o$). The lower zone temperature $T_L$ was 610° C. The axial and radial composition of the crystal formed in Example 3 is shown in the Summary Table.

SUMMARY TABLE

| EXAMPLE | 1 | | | | 2 | | | | | | 3 | | |
|---|---|---|---|---|---|---|---|---|---|---|---|---|---|
| Overall Composition, $x_o$ | 0.150 | | | | 0.309 | | | | | | 0.209 | | |
| crystal length, mm | 205 | | | | 267 | | | | | | 230 | | |
| ampule inner diameter, mm | 12 | | | | 10 | | | | | | 12 | | |
| $T_U$, °C. | 712 | | | | 824 | | | | | | 780 | | |
| $T_L$, °C. | 670 | | | | 220 | | | | | | 610 | | |
| $T_I$, °C. | 695 | | | | 727 | | | | | | 706 | | |
| R, cm/day (μm/second) | 1.26 (0.146) | | | | 1.10 (0.127) | | | | | | 0.62 (0.072) | | |
| barrier thickness, mm | 1 | | | | 38 | | | | | | 4 | | |
| Distance from tip of crystal to slice, mm | 30 | 80 | 130 | 190 | 40 | 80 | 115 | 140 | 175 | 200 | 53 | 105 | 145 |
| Overall composition of slice, x | 0.14 | 0.16 | 0.145 | 0.145 | N/A | N/A | N/A | N/A | N/A | N/A | 0.242 | .223 | .218 |
| Total compositional variation across slice, Δx | .04 | .03 | .025 | .025 | .06 | .06 | .07 | .05 | .08 | .09 | .008 | .012 | .016 |

While this specification sets forth in detailed examples a present and preferred practice of the method and the materials formed thereby, these examples are for purposes of illustration. In practice, variations from such detail may be resorted to as are not a departure from the spirit of the invention, as will be appreciated by those skilled in the art. Such variations are within the spirit of the invention disclosed herein. The invention is to be restricted only by the scope of the appended claims.

We claim:

1. In a method of growing pseudobinary crystals and the like by a modified Bridgman-Stockbarger technique, the improvement comprising, maintaining the temperature of an upper zone in a crystal growth furnace at a temperature effective to create a cavitated solid/liquid in the portion of an alloy composition placed in the upper zone and directionally solidifying the liquid from the cavitated solid/liquid in the lower zone of the furnace while translating the alloy relatively through the furnace in the direction of from the upper zone to the lower zone and controlling the temperatures of the upper and lower zones at levels effective to produce multi-directional homogeneity in the alloy crystals.

2. The method of claim 1 wherein the upper and lower zones are separated by a thin insulating barrier.

3. The method of claim 2 wherein the insulating barrier is less than about 4 mm in thickness.

4. The method of claim 2 wherein the insulating barrier is constructed of materials selected from the group consisting of fibrous alumina, silica and zirconia.

5. The method of claim 2 wherein the thermal view angles $\alpha$ and $\beta$ of the alloy composition in relation to the barrier are substantially equal.

6. The method of claim 1 wherein the alloy solidifies at an interface between the upper and lower zones and wherein the temperatures of the upper zone $T_U$, the lower zone $T_L$, and the temperature of the alloy at the solidifying interface $T_I$, are maintained substantially according to the following relationship:

$$T_U^4 - T_I^4 + T_I^4 - T_L^4.$$

7. The method of claim 6 wherein $T_U$ is maintained at a temperature of less than about the liquidus temperature for the alloy.

8. The method of claim 6 wherein $T_U$ is maintained at about 10° C. below the liquidus temperature for the alloy.

9. The method of claim 1 wherein the alloy is HCT alloy of composition $Hg_{1-x} Cd_x Te$ and wherein the value of mole fraction x is between about 0.15 and 0.6.

10. The method of claim 1 wherein the translation rate, R, is maintained according to the relationship $$dx/dl_{l=0} = (x_o R/D)(k-1)/k.$$

where D is the diffusion coefficient, $x_o$ is the initial overall material composition, k is the segregation coefficient for the composition and l is the distance to the interface.

11. The method of claim 10 wherein the translation rate is maintained at about 0.068 μm/second.

12. In a method of growing pseudobinary HCT alloy crystals and the like by a modified Bridgman-Stockbarger technique the improvement comprising introducing an ampule containing a solidified HCT alloy having the composition $Hg_{1-x} Cd_x Te$, where x is the mole fraction of Cd and x is between about 0.15 and 0.6, into a Bridgman-Stockbarger function having an upper hot zone and a lower cold zone, the upper zone and the lower zone being separated by an insulating barrier, the ampule being initially positioned substantially in the upper zone, and the upper zone being maintained at a temperature sufficient to produce a cavitated alloy solid/liquid in the ampule in the portion maintained in the upper zone, directionally solidifying the liquid alloy from the cavitated solid/liquid by collecting liquid alloy from the cavitated solid/liquid in the portion of the ampule below the cavitated solid/liquid and translating the ampule relatively through the furnace from the upper zone to the lower zone, the lower zone being maintained at a temperature sufficient to solidify the alloy, the liquid from the cavitated solid/liquid and the solidifying alloy forming an interface, and maintaining the interface substantially at the location of the thermal barrier, the temperatures of the upper zone $T_U$, the lower zone $T_L$, and the solidifying temperature of the alloy at the interface $T_I$ being maintained substantially according to the following relationship:

$$T_U^4 - T_I^4 = T_I^4 - T_L^4,$$

the method being effective to produce a homogeneous alloy composition.

13. The method of claim 12 wherein $T_U$ is maintained at about 10° C. below the liquidus temperature for the alloy.

14. The method of claim 12 wherein the thermal barrier is less than about 4 mm in thickness.

15. The method of claim 14 wherein the thermal barrier is selected from insulating materials consisting of fibrous alumina, silica and zirconia.

16. The method of claim 12 wherein the thermal view angles of the solidifying alloy interface at the thermal barrier, $\alpha$ and $\beta$, are substantially equal.

17. The method of claim 12 wherein the translation rate, R, is maintained according to the relationship:

$$dx/dl_{l=0} = (x_o R/D)(k-1)/k,$$

wherein D is the diffusion coefficient, $x_o$ is the initial overall material composition, k is the segregation coefficient for the composition and l is the distance to the interface.

18. The method of claim 17 wherein the translation rate is about 0.068 $\mu$m/ second.

19. The process of claim 1 wherein the cavitated solid is maintained in the upper zone during at least part of the solidifying step.

20. The process of claim 12 including the step of maintaining a cavitated solid in the upper zone throughout a substantial portion of the solidifying step.

* * * * *

UNITED STATES PATENT AND TRADEMARK OFFICE
CERTIFICATE OF CORRECTION

PATENT NO. : 4,545,848
DATED : October 8, 1985
INVENTOR(S) : Sandor L. Lehoczky & Frank R. Szofran It is certified that error appears in the above-identified patent and that said Letters Patent are hereby corrected as shown below:

Column 6, lines 43 and 44, delete "sur-" and "face" respectively and insert --furnace--.

Signed and Sealed this

Twelfth Day of August 1986

[SEAL]

Attest:

DONALD J. QUIGG

Attesting Officer

Commissioner of Patents and Trademarks